United States Patent
Al-Shamma et al.

(10) Patent No.: US 6,400,633 B1
(45) Date of Patent: Jun. 4, 2002

(54) POWER-SAVING MODES FOR MEMORIES

(75) Inventors: Ali Al-Shamma, San Jose; Takao Akaogi, Cupertino; Lee Cleveland, Clara, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/675,372

(22) Filed: Sep. 29, 2000

Related U.S. Application Data

(60) Provisional application No. 60/181,671, filed on Feb. 11, 2000.

(51) Int. Cl.$^7$ .............................................. G11C 7/00
(52) U.S. Cl. ................... 365/227; 365/189.01; 365/228
(58) Field of Search ................ 365/226, 227, 365/189.01, 230.01, 228

(56) References Cited

U.S. PATENT DOCUMENTS

| | | | |
|---|---|---|---|
| 5,022,004 A | 6/1991 | Kurtze et al. .......... 365/189.07 |
| 5,777,923 A * | 7/1998 | Lee et al. .............. 365/185.11 |
| 5,829,026 A | 10/1998 | Leung et al. ................ 711/122 |
| 5,896,335 A * | 4/1999 | Myers et al. ................ 365/203 |
| 6,052,302 A * | 4/2000 | Moyer et al. ................ 365/173 |
| 6,151,667 A * | 11/2000 | Walters ....................... 711/211 |

* cited by examiner

*Primary Examiner*—Viet Q. Nguyen

(57) ABSTRACT

A system and a method are disclosed for providing a power saving mode during reading a memory device. A new memory content is read from the memory and, before being put at the memory output bus, is compared with the previously read memory content, which is currently on the output bus of the memory device. If the result of the comparison indicates that more than half of the memory output bits have to be toggled in order to put the new memory content on the memory output bus, the new data is inverted internally in order to reduce the number of output pins toggles. Then, the memory device sends a signal to the microprocessor or microcontroller indicating that the new data is inverted, and that the new data has to be inverted back before being put on the memory output bus.

8 Claims, 2 Drawing Sheets

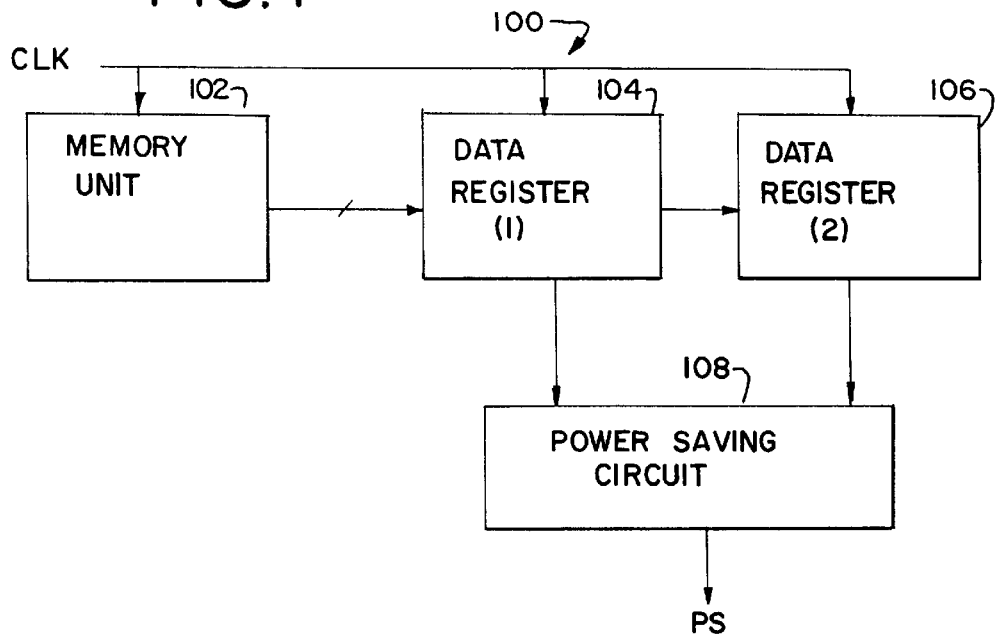
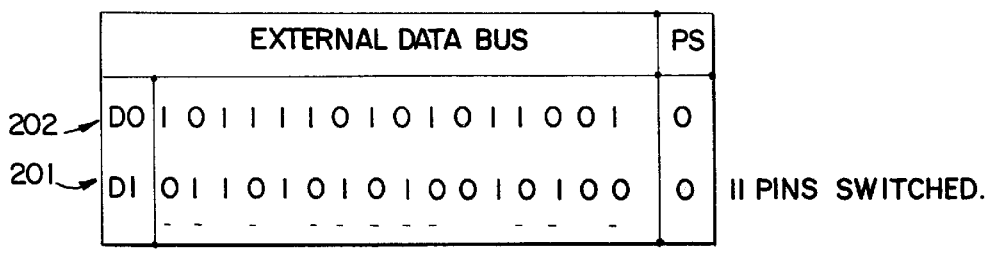
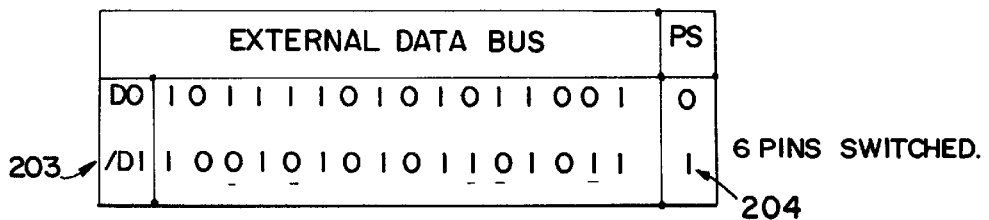

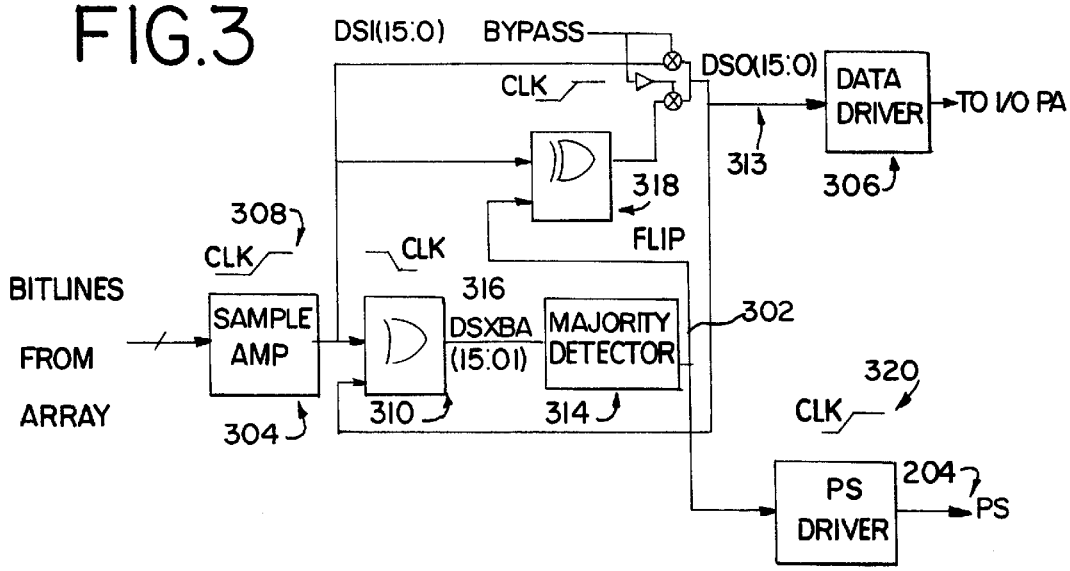
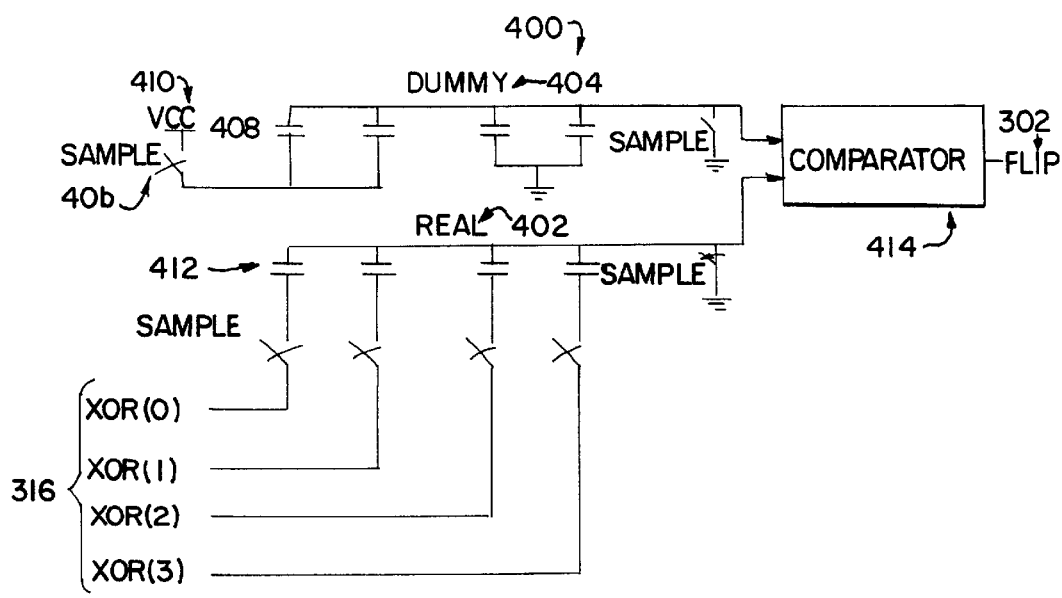

POWER-SAVING MODES FOR MEMORIES

This application claims benefit to U.S. Provisional application Ser. No. 60/181,671, filed Feb. 11, 2000.

BACKGROUND OF THE INVENTION

The present invention relates generally to electrically erasable and programmable non-volatile memories. More particularly, this invention relates to a method and system that provide a power-saving function for flash memory devices.

Electronic systems typically include processors and memory. The memory is used to store instructions and data. In some systems, such as cellular phones, non-volatile memory is needed to ensure that the stored data is not lost even when the system is turned off. One non-volatile memory family is Read Only Memory (ROM), Programmable ROM (PROM), and Erasable-Programmable ROM (EPROM), with varying degrees of flexibility of use. ROM memories have high density, low power consumption, and high performance, but they are not in-system updateable. On the other hand is the volatile memory family of Random Access Memory (RAM), Dynamic RAM (DRAM), and battery-backed Static RAM (SRAM). The RAM family, however, is in-system updateable and has high performance, but it is volatile. DRAM stores temporary data, and SRAM integrates a battery to retain stored data when system power is removed. SRAM is considerably more expensive than DRAM. Electrically-Erasable-Programmable ROM (EEPROM) is a special kind of ROM that is in-system modifiable on a byte-by-byte basis, like RAM, but it is also non-volatile, like ROM.

Flash memory is one type of inherently nonvolatile memory, with no refresh or battery requirements, which can be erased or programmed in units of memory called blocks. It is a variation of EEPROM which, unlike flash memory, is erased and rewritten at the byte level, which is slower than flash memory updating. Flash memory is often used to hold control code such as BIOS in personal computer. When BIOS needs to be changed, the flash memory can be updated in block (rather than byte) sizes, making it easy to update. Flash memory is used in digital cellular phones, digital cameras, LAN switches, PC cards for notebook computers, digital set-up boxes, embedded controllers, and other devices. Flash memory is in-system updateable. Its simpler cell architecture (only one transistor) gives it significant density advantages over both EEPROM and SRAM, and compares favorably with densities achieved by ROM and DRAM on analogous manufacturing processes. Finally, flash memory is the only approach to satisfy the desired characteristics of nonvolatility, upgradeability, high density, and low cost.

One problem with prior flash memories is that they suffer from extraneous power consumption during a memory read. During a memory read, to update the output bus of the memory unit with a new memory data, a number of output bits have to be toggled. Each toggling of the output bits, however, consumes considerable power because there is a capacitance associated with the output of the memory device that dissipates considerable amount of charge for each toggling of the output bits. There is a need, therefore, for reducing the number of output bits that need to be toggled, and thus providing a power saving-mode for synchronous reading of memory data.

BRIEF SUMMARY

The present invention is defined by the following claims, and nothing in this section should be taken as a limitation on those claims. By way of introduction, in one embodiment, once a new memory content is read from the memory, before being put at the memory output bus, it is compared with the previously read memory content which is currently on the output bus of the memory device. If the result of the comparison indicates that more than a predetermined number of the output bits have to be toggled in order to put the new memory content on the memory output bus, the new data is internally inverted to reduce the number of toggles at the output bus. The memory device then sends a signal to a state machine/controller indicating that the new data has been internally inverted, and that the inverted data has to be inverted back before being put on the memory output bus.

Additional aspects, features and advantages of the present invention will become apparent from the following description of its preferred embodiments, which description should be taken in conjunction with the accompanying drawings.

BRIEF DESCRIPTION OF SEVERAL VIEWS OF THE DRAWINGS

The present invention is illustrated by way of example and not limitation in the accompanying figures. In the figures, like reference numbers indicate identical or functionally similar elements. Additionally, the left-most digit(s) of a reference number identifies the figure in which the reference number first appears.

FIG. 1 is a block diagram of a memory device according to the present invention;

FIG. 2 is a representation of an exemplary power saving mode;

FIG. 3 is block diagram for the power saving circuit of FIG. 1;

FIG. 4 is circuit diagram for the majority-detector circuit of FIG. 3.

DETAILED DESCRIPTION OF EMBODIMENTS

Referring to FIG. 1, it shows a block diagram 100 of the memory power saving system according to one embodiment. In the illustrated embodiment, the memory unit 102 is configured as a flash memory formed as arrays of memory cells. However, the memory unit 102 may take any other suitable form. During the synchronous reading of data from memory unit 102, the content of an array of memory is read from memory unit 102 at either the leading edge, or in alternative embodiments at the falling edge, of the clock signal provided by the state machine/controller (not shown). Two successive memory contents, which are read from memory unit 102, are stored in registers 104 and 106. Register 104 holds the new data while register 106 holds the previously read data. The data which is held in register 106 is also currently on the memory output bus. These two memory contents are sent to a power-saving circuit 108. Power-saving circuit 108 compares the two data to determine the number of bits by which the two data are different, and hence the number of memory output bits that have to be toggled in order to put the new data at the output of the memory device. Each toggling of the output bits consumes considerable power because there is a capacitance associated with the output of the memory device that dissipates considerable amount of charge for each toggling of the output bits.

In one aspect of the present invention, the power consumed during a memory read is minimized by minimizing the number of output bits that have to be toggled in order to update the output bus with the new memory content. If circuit 108 determines that more than a predetermined number of output bits have to be toggled, then the new data is inverted and a signal is sent to the state machine/controller (not shown). This signal indicates that the new data has to be inverted back to its original value before it is put on the output of the memory device. In one aspect of this invention, the new memory data is inverted if the number of output pins needed to toggle is more than half of the number of memory output bits.

Referring to FIG. 2, in part (a) a new data 201, labeled D1, and the current data 202, labeled D0, at the output of the memory unit 102 are compared bit by bit. As illustrated in part (a), to replace D0 with the new data D1, eleven output pins have to be switched (toggled). If, however, the new data D1 is inverted internally, as shown 203 in part (b), only six memory output pins need to be switched (toggled). In the latter case the Power Saving ("PS") signal 204 is asserted to indicate that a power saving mode is engaged and that D1 is inverted.

FIG. 3 shows one embodiment of the power saving circuit 108. The circuit includes sample amplifiers 304, output driver 306, majority detector circuit 314, and logic gates 310, 318. When PS signal 204 is disabled, indicating that the memory device is not engaged in a power saving mode as in part (a) of FIG. 2, the output of the sample amplifiers 304, DSI, are passed directly the output drivers 306. When PS signal is enabled, indicating that the memory device is engaged in a power saving mode as in part (b) of FIG. 2, the first data cycle is allowed to bypass without power saving, but the following data cycles are all power saved, as described below.

On the rising edge of CLK signal 308, during a power saving cycle, the output of the sample amplifiers 304, DSI(15:0), is XOR'ed 310 with the data currently being driven to the external bus 312, DSO(15:0). At the falling edge of the CLK signal 308, a majority-detector circuit 314 determines whether more than half of lines in the XOR bus 316 is high. If so, the new memory content is inverted (flipped) and the FLIP signal 302 goes high. On the following rising edge of CLK signal 320, the FLIP signal drives the PS pin 204 high, and the XOR 318 of FLIP signal 302 and DSI(15:0) drives the DSO(15:0) bus 312. At the same time, the sense amplifier (not shown) drives the next memory content that will again go through the power saving circuit.

FIG. 4 shows a circuit diagram 400 for majority-detector circuit 314 (FIG. 3) according to one embodiment. The circuit includes lines 402, 404, sampling switch 406, power supply Vcc 410, capacitors 408, 412, and comparator 414. Majority detector circuit 314 is used to determine if more than half of the lines of the XOR bus 316 are high. For simplicity, only four bits of DSI (15:0) are shown 316 in FIG. 4. The two lines REAL 402 and DUMMY 404 are initially grounded. Upon the closing of sampling switch 406, half of the capacitors 408 connected to DUMMY line 404 are switched. By charge distribution, the voltage of DUMMY line 404 will be approximately half the supply voltage Vcc 410. At the same time the capacitors 412 connected to REAL line 402 are connected to the XOR bits 316. If two of the four XOR bits are high, REAL line 402 would settle at a lower voltage than DUMMY line 404 and vice versa. A comparator 414 compares the value of REAL and DUMMY lines and if REAL is higher, then Flip signal 302 goes high indicating that the data needs to be inverted, as in part (b) of FIG. 2.

Therefore, by reducing the number of output pins that have to be toggled, for updating the memory output bus with a new memory content, a power-saving mode is provided for memory data read. The current data at the memory output bus and a new memory data that should replace the current data at the memory output bus are compared. If the two data differ by more than half of their data bits, the new data is inverted before being placed at the memory output bus, and a power saving signal is asserted to indicate the data conversion. Therefore, the disclosed method and system provide more efficient memory devices that consume less power and dissipate less heat.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A method for providing a power-saving mode for a memory read operation, comprising:
   (a) reading a new data from a memory device before being put on a memory output bus of said memory device;
   (b) determining whether to engage said memory device in a power saving mode utilizing previously read data already on said memory output bus;
   (c) if (b) indicates to engage said memory device in said power saving mode,
      (1) engaging said memory device in said power saving mode,
      (2) providing said new data of said memory device at an output of said memory device; and
   (d) if (b) indicates not to engage said memory device in said power saving mode, providing said new data of said memory device at said output of said memory device.

2. The method of claim 1 wherein (b) further comprises comparing said new data of said memory device with said previously read data already on said memory output bus.

3. The method of claim 2 wherein (b) further comprises indicating to engage said memory device in said power saving mode when said new data of said memory device and said previously read data already on said memory output bus are different in more than half of their data bits.

4. The method of claim 2 wherein (c)(1) comprises inverting said new data of said memory device, and (c)(2) comprises inverting said new data back to its original value.

5. A system for providing a power-saving mode for a memory read operation, comprising:
   (a) means for reading a new data from a memory device before being put on a memory output bus of said memory device
   (b) means for determining whether to engage said memory device in a power saving mode utilizing previously read data already on said memory output bus;
   (c) if said means in (b) indicate to engage said memory device in said power saving mode, said means further including:
      (1) means for engaging said memory device in said power saving mode,
      (2) means for providing said new data of said memory device at an output of said memory device; and
   (d) if said means in (b) indicate not to engage said memory device in said power saving mode, said means further including means for providing said new data of said memory device at said output of said memory device.

6. The system of claim 5 wherein said means in (b) comprises means for comparing said new data of said memory device with said previously read data already on said memory output bus.

7. The system of claim 6 wherein said means in (b) comprises means for indicating to engage said memory device in said power saving mode when said new data of said memory device and said previously read data already on said memory output bus are different in more than half of their data bits.

8. The system of claim 6 wherein said means in (c)(1) comprises means for inverting said new data of said memory device, and (c)(2) comprises means for inverting said new data back to its original value.

* * * * *